(12) United States Patent
Lin et al.

(10) Patent No.: US 11,887,929 B2
(45) Date of Patent: Jan. 30, 2024

(54) TECHNIQUES TO INHIBIT DELAMINATION FROM FLOWABLE GAP-FILL DIELECTRIC (71) Applicant: Taiwan Semiconductor Manufacturing Company, Ltd., Hsin-Chu (TW)

(72) Inventors: Hsing-Lien Lin, Hsin-Chu (TW); Chin-Wei Liang, Zhubei (TW); Hsun-Chung Kuang, Hsinchu (TW); Ching Ju Yang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 8 days.

(21) Appl. No.: 17/868,827

(22) Filed: Jul. 20, 2022

(65) Prior Publication Data

US 2022/0367342 A1 Nov. 17, 2022

Related U.S. Application Data

(62) Division of application No. 17/078,538, filed on Oct. 23, 2020, now Pat. No. 11,495,532.

(Continued)

(51) Int. Cl.
*H01L 23/522* (2006.01)
*H01L 21/768* (2006.01)
*H01L 23/528* (2006.01)

(52) U.S. Cl.
CPC .... *H01L 23/5226* (2013.01); *H01L 21/76802* (2013.01); *H01L 21/76879* (2013.01); *H01L 23/528* (2013.01)

(58) Field of Classification Search
CPC .......... H01L 23/5226; H01L 21/76802; H01L 21/76879; H01L 23/528; H01L 21/76829;
(Continued)

(56) References Cited

U.S. PATENT DOCUMENTS 6,351,039 B1  2/2002  Jin et al.
6,784,121 B1  8/2004  Jin et al.
(Continued)

FOREIGN PATENT DOCUMENTS

EP    0881678 A2    12/1998
JP  2008066547 A     3/2008

OTHER PUBLICATIONS

Notice of Allowance dated Jun. 17, 2022 for U.S. Appl. No. 17/078,538.

*Primary Examiner* — Bac H Au
(74) *Attorney, Agent, or Firm* — Eschweiler & Potashnik, LLC (57) ABSTRACT

An interfacial layer is provided that binds a hydrophilic interlayer dielectric to a hydrophobic gap-filling dielectric. The hydrophobic gap-filling dielectric extends over and fill gaps between devices in an array of devices disposed between two metal interconnect layers over a semiconductor substrate and is the product of a flowable CVD process. The interfacial layer provides a hydrophilic upper surface to which the interlayer dielectric adheres. Optionally, the interfacial layer is also the product of a flowable CVD process. Alternatively, the interfacial layer may be silicon nitride or another dielectric that is hydrophilic. The interfacial layer may have a wafer contact angle (WCA) intermediate between a WCA of the hydrophobic dielectric and a WCA of the interlayer dielectric.

20 Claims, 8 Drawing Sheets

Related U.S. Application Data (60) Provisional application No. 62/982,466, filed on Feb. 27, 2020.

(58) Field of Classification Search
CPC ......... H01L 23/53295; H01L 21/02126; H01L 21/76877; H01L 21/76837; H10B 61/00; H10B 63/80
See application file for complete search history.

(56) References Cited

U.S. PATENT DOCUMENTS

| | | |
|---|---|---|
| 6,800,547 B2 | 10/2004 | Lu et al. |
| 9,773,741 B1 | 9/2017 | Gu et al. |
| 11,114,606 B2 | 9/2021 | Reznicek et al. |
| 2002/0017641 A1 | 2/2002 | Lu et al. |
| 2007/0273044 A1 | 11/2007 | Yang et al. |
| 2008/0032472 A1 | 2/2008 | Yu et al. |
| 2011/0244680 A1 | 10/2011 | Tohnoe et al. |
| 2012/0270339 A1 | 10/2012 | Xie et al. |
| 2015/0155233 A1 | 6/2015 | Tan et al. |
| 2015/0214226 A1 | 7/2015 | Su et al. |
| 2015/0311114 A1 | 10/2015 | Huang et al. |
| 2016/0172237 A1 | 6/2016 | Bristol et al. |
| 2017/0033043 A1 | 2/2017 | Lin et al. |
| 2017/0263548 A1 | 9/2017 | Chen et al. |
| 2018/0351099 A1 | 12/2018 | Yang et al. |
| 2018/0366640 A1 | 12/2018 | Cleavenger et al. |
| 2019/0164751 A1 | 5/2019 | Chi et al. |
| 2019/0378915 A1 | 12/2019 | Frougier et al. |
| 2020/0066580 A1* | 2/2020 | Peng ................ H01L 21/31056 |
| 2021/0091302 A1 | 3/2021 | Reznicek et al. |
| 2021/0098289 A1 | 4/2021 | Uttwani et al. |
| 2021/0134668 A1 | 5/2021 | Huang et al. |

\* cited by examiner

TECHNIQUES TO INHIBIT DELAMINATION FROM FLOWABLE GAP-FILL DIELECTRIC

REFERENCE TO RELATED APPLICATIONS

This Application is a Divisional of U.S. application Ser. No. 17/078,538, filed on Oct. 23, 2020, which claims the benefit of U.S. Provisional Application No. 62/982,466, filed on Feb. 27, 2020. The contents of the above-referenced Patent Applications are hereby incorporated by reference in their entirety.

BACKGROUND

The integrated circuit device manufacturing industry has experienced exponential growth over the last few decades. As integrated circuit devices have evolved, functional density (e.g., the number of integrated circuit devices per chip area) has increased while feature sizes have decreased. As feature sizes decrease, it becomes more and more difficult to fill gaps between features during manufacturing. For example, if a chip includes "tall" structures that are closely spaced (i.e., separated from one another in the lateral direction by only a small "gap"), the "gap" can be said to have a high aspect ratio. Such high aspect ratio gaps are difficult to fill. Conventional dielectric growth processes, such as chemical vapor deposition (CVD), tend to "pinch off" near the tops of the gaps, thereby leaving voids in the lower areas of the gaps. These voids may be undesirable, potentially leading to structural integrity issues, for example. Flowable CVD processes have been developed to address these issues. Flowable CVD processes form a liquid on the chip surface that flows to fill high aspect ratio gaps. A cure process solidifies the liquid to produce a gap-filling dielectric that is substantially free of voids.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Spatially relative terms, such as "beneath," "below," "lower," "above," "upper", and the like, may be used herein to describe one element or feature's relationship to another element(s) or feature(s) as illustrated in the figures. These spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may be interpreted accordingly. Terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

Some aspects of the present disclosure relate to an interfacial layer that binds a hydrophilic interlayer dielectric to a hydrophobic gap-filling dielectric. In some embodiments, the hydrophobic gap-filling dielectric is a low-κ dielectric. In some embodiments, the hydrophobic gap-filling dielectric fills gaps between and extends over devices in an array of devices formed within a metal interconnect structure disposed over a semiconductor substrate. The interfacial layer provides a hydrophilic upper surface to which the interlayer dielectric adheres.

In some embodiments, the hydrophobic dielectric is the product of a flowable CVD process. It was observed that an interlayer dielectric such as undoped silicate glass (USG) did not always adhere well to a dielectric formed by a flowable CVD process. Further investigation revealed that relatively weak adhesion was associated with the flowable CVD process having produced a dielectric with a hydrophobic surface (low surface energy). It was found, moreover, that a thin interfacial layer could be made to adhere to the hydrophobic surface while itself providing a hydrophilic surface (high surface energy) to which the interlayer dielectric would strongly adhere.

The compounds suitable for the interfacial layer present a hydrophilic upper surface. A hydrophilic surface is one having a wafer contact angle (WCA) less than 90°. In some embodiments, the hydrophilic upper surface has a WCA of 50° or less. In some embodiments, the hydrophilic upper surface has a WCA of 10° or less. Interfacial layers with lower WCA are associated with better adhesion of the interlayer dielectric.

In some embodiments, the interfacial layer includes silicon nitride ($Si_3N_4$) or the like. Silicon nitride has been found to be effective in adhering a USG interlayer dielectric to an underlying silicon oxycarbide (SiOC) layer produced by a flowable CVD process and having a hydrophobic upper surface. In some embodiments, the interfacial layer includes oxygen-rich silicon oxycarbide. The oxygen-rich silicon oxycarbide may be formed by a flowable CVD process using the same tool that is used to form the gap-filling hydrophobic dielectric. Additional compounds that may be suitable for the interfacial layer include silicon oxynitride (SiON), silicon dioxide produced by chemical vapor deposition of tetraethyl orthosilicate (TEOS), silicon rich oxide (SRO), and the like. All of these materials may provide a surface with a WCA of 10° or less.

The WCA of a material may be measured by applying a water droplet to a layer of that material formed on a wafer. The angle formed by the water-vapor interface and the water-solid interface at their point of intersection is the wafer contact angle. The WCA is largely determined by the composition of the solid material. The WCA may also be affected by surface roughness and functional groups left on the surface by the deposition process or by post deposition processing. For example, while silicon dioxide produced from TEOS in a chemical vapor deposition (CVD) process is hydrophilic, it may be less hydrophilic than silicon dioxide produced from silicon hydride ($SiH_4$) or under distinct processing conditions.

In some embodiments, the WCA of the interfacial layer is intermediate between that of the hydrophobic dielectric and that of the interlayer dielectric. For example, a USG interlayer dielectric may have a WCA of about 4° while the interfacial layer may have a WCA in the range from about 5° to 10°. An interfacial layer with a WCA greater than the interlayer dielectric may provide better adhesion to the hydrophobic dielectric.

In some embodiments, the interfacial layer has a thickness in the range from 50 Å to 600 Å. In some embodiments, the interfacial layer has a thickness in the range from 100 Å to 500 Å. In some embodiments, the interfacial layer has a thickness in the range from 200 Å to 400 Å. If the interfacial layer is too thin, it may not be effective for adhering the interlayer dielectric to the hydrophobic dielectric. If the interfacial layer is to thick, it may impact an etching process used to form a via through the interlayer dielectric and the hydrophobic dielectric.

Some aspects of the present disclosure relate to an integrated circuit device that includes a metal interconnect structure over a semiconductor substrate. The metal interconnect structure includes a plurality of metal interconnect layers. An array of device structures is disposed between two of the metal interconnect layers. Each of the device structures includes a top electrode. A hydrophobic dielectric fills gaps between the device structures and extends over the device structures. An interlayer dielectric is disposed above the hydrophobic dielectric. The interlayer dielectric adheres to an interfacial layer of hydrophilic dielectric positioned between the interlayer dielectric and the hydrophobic dielectric. Vias connect the top electrodes to conductors within an upper of the two metal interconnect layers. Each of the vias rises from a respective top electrode and passes successively through the hydrophobic dielectric, the interfacial layer, and the interlayer dielectric. The interfacial layer is distinct from any etch layers or the like aligned to the top electrode.

In some embodiments, the vias also pass through an etch stop layer located between the top electrodes and the hydrophobic dielectric. In some embodiments, the etch stop layer has a composition that is the same or similar to that of the interfacial layer. In some embodiments, the etch stop layer is silicon nitride ($Si_3N_4$). In some embodiments, the interfacial layer is thinner than the etch stop layer. Having the interfacial layer thinner than the etch stop layer facilitates formation of the vias.

In some embodiments, the device structures are memory cells. In some embodiments, the device structures are capacitors. In some embodiments, the device structures are covered by an encapsulation layer that functions as an etch stop layer. In some embodiments, the encapsulation layer has a uniform thickness of the type that may be achieved by atomic layer deposition (ALD). The gaps may be high aspect ratio gaps between the device structures. In some embodiments, the gaps have an aspect ratio (maximum depth to minimum width) of 10:1 or greater. In some embodiments, the gaps have an aspect ratio (maximum depth to minimum width) of 15:1 or greater. In some embodiments, the gaps have an aspect ratio (maximum depth to minimum width) of 20:1 or greater.

The semiconductor substrate to which the hydrophobic dielectric is applied may include a first region in which the array of device structures is present and a second region in which no such array is present. When the hydrophobic dielectric is formed through a flowable CVD process, the liquid is applied in sufficient volume to fill gaps between the device structures in the first region. The liquid is also applied to the second region, but the liquid is not ordinarily applied in such a volume as to raise the surface in the second region to the height of the device structures. The liquid may be solidified to form the hydrophobic dielectric using heat, oxygen, ultraviolet light (UV), a combination thereof, or by some other method.

In some embodiments, the resulting hydrophobic dielectric has an upper surface with a greater maximum height in the first region than in the second region. Because the liquid is attracted to the surfaces it coats, in some embodiments the upper surface forms with hills and valleys in the first region. The hills rise over and correspond to individual device structures in the array. In some embodiments, the hills over the individual device structures are convex. The valleys are located between the device structures and have low points along diagonals between array elements.

The interfacial layer may conform substantially to the upper surface of the hydrophobic dielectric. Accordingly, in some embodiments an upper surface of the interfacial layer has a greater maximum height in the first region than in the second region and in some embodiments an upper surface of the interfacial layer forms hills and valleys in the first region. These peaks, hills, and valleys correspond to peaks, hills, and valleys in the hydrophobic dielectric.

Some aspects of the present teaching relate to a method that includes receiving a semiconductor substrate and forming a hydrophobic dielectric by a flowable chemical vapor deposition process to fill gaps between structures formed above the semiconductor substrate. The hydrophobic dielectric extends over a first region and a second region of the semiconductor substrate, which have different topographies. An interfacial layer is formed over and adheres to the hydrophobic dielectric, the interfacial layer having a hydrophilic upper surface. The interfacial layer has an upper surface extending over the first region and the second region, the upper surface having a greater maximum height over the semiconductor substrate in the first region than in the second region. An interlayer dielectric is formed over and adheres to the hydrophilic upper surface.

In some embodiments, the first region is a region in which there is an arrangement of devices and the maximum height is achieved over one of the devices. The second region may be free of similar devices. In some embodiments, the first region is a region over one device in an arrangement of devices and the second region is a region between devices in the arrangement of devices. In some embodiments, the method further includes planarizing the interlayer dielectric by chemical mechanical polishing (CMP).

In some embodiments, the hydrophobic dielectric extends over and between devices in an array. In some embodiments, the method further includes etching openings that extend through the interlayer dielectric, the interfacial layer, and the hydrophobic dielectric and filling the openings with conductive material to form vias that contact top electrodes of devices in the array. In some embodiments, the openings extend through an etch stop layer that is underneath the hydrophobic dielectric. In some embodiments, the etch stop layer has a footprint corresponding to the top electrodes. In some embodiments, the etch stop layer is an encapsulation layer extending over the top electrodes and down the sides of the devices. In some embodiments, the etch stop layer may be silicon nitride ($Si_3N_4$) or the like.

In some embodiments, the interfacial layer is formed by a second flowable chemical vapor deposition process. In some embodiments, the semiconductor substrate is part of a wafer and both the hydrophobic dielectric and the interfacial layer are formed over the semiconductor substrate in one tool without removing the wafer. In some embodiments, the hydrophobic dielectric is a low-κ dielectric that may be formed by a flowable CVD process. In some embodiments, the hydrophobic dielectric is SiOC or the like. In some embodiments, the interfacial layer is oxygen rich SiOC or the like.

Figure 1:
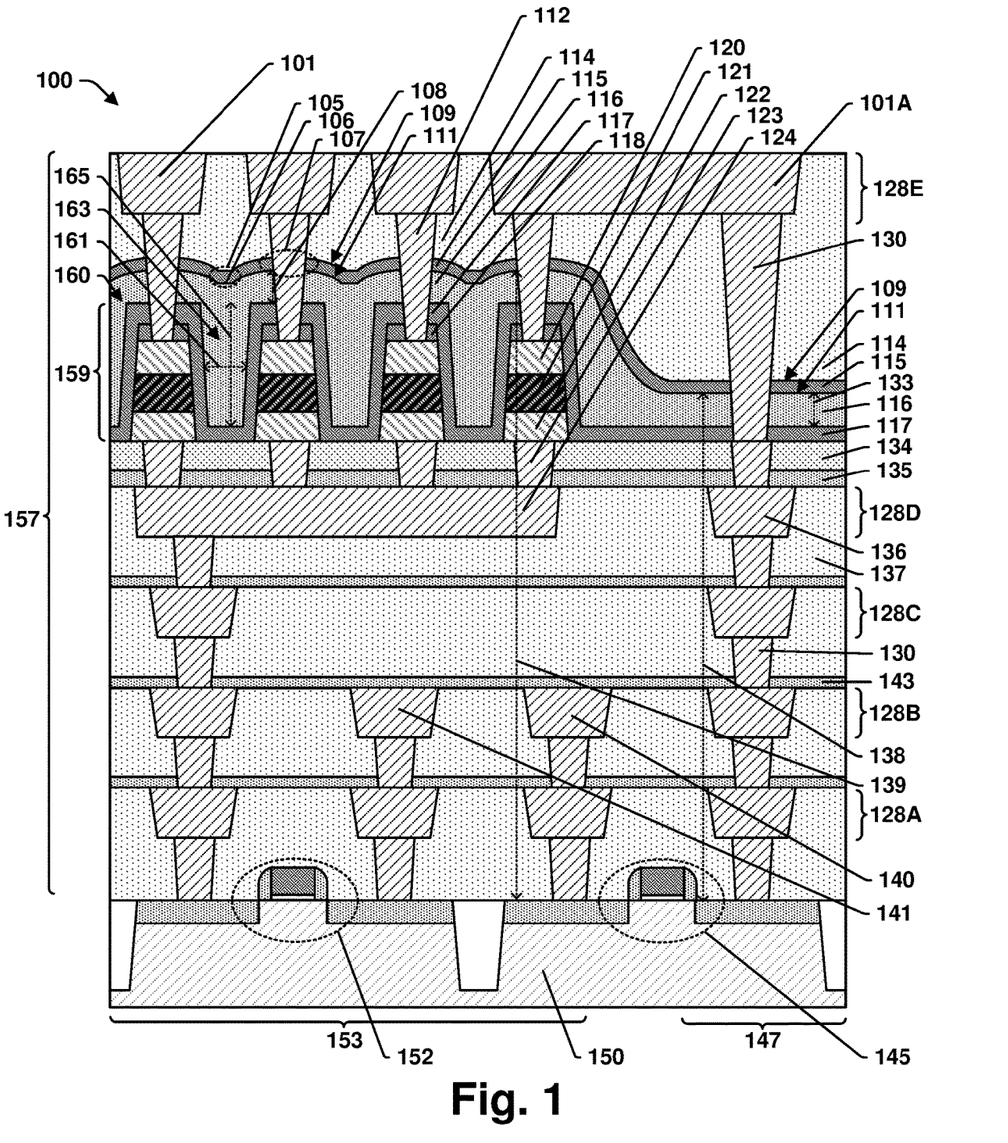
FIG. 1 illustrates a cross-sectional view of an integrated circuit (IC) device with a dielectric structure according to some aspects of the present disclosure.

FIG. 1 illustrates a cross-sectional view of an integrated circuit device 100 that includes a metal interconnect structure 157 over a semiconductor substrate 150. The metal interconnect structure 157 includes metal interconnect layers 128A-128E and may include additional layers that are not shown. Each of the metal interconnect layers 128A-128E includes metal features 136, which may be wires or vias. Vias 130 connect metal features 136 in adjacent interconnect layers 128A-128E.

An array 159 of memory cells 160 is located between the metal interconnect layer 128D (the fourth metal interconnect layer) and the metal interconnect layer 128E (the fifth metal interconnect layer) but could be located elsewhere in the metal interconnect structure 157. Each of the memory cells 160 includes a bottom electrode 122 and a top electrode 120 separated by a data storage layer 121. An etch stop layer 118, which may also be a hard mask layer, may be disposed above the top electrodes 120 and may have edges aligned with edges of the top electrodes 120. An encapsulation layer 117, which may also be an etch stop layer, extends over and around the memory cells 160.

Vias 112 connect the top electrodes 120 with conductive features in the metal interconnect layer 128E. The conductive features may be bit lines 101. The vias 112 rise from the top electrodes 120 successively through the etch stop layer 118, the encapsulation layer 117, a hydrophobic dielectric 116, an interfacial layer 115, and an interlayer dielectric 114.

The hydrophobic dielectric 116 fills gaps 163 between adjacent memory cells 160. These gaps may have a high aspect ratio. The aspect ratio is a ratio of the gap depth 165 to the gap width 161 measured at a midpoint of the depth 165. If the gap 165 has a minimum width at a point between the top and the bottom, the width 161 may be measured at that minimum. Although not evident from the drawings due to the scaling of features, the gaps 163 may have an aspect ratio of 20:1 or greater.

To ensure complete gap fill, the hydrophobic dielectric 116 is applied in an amount that is in excess of a minimum amount needed to fill the gaps 163, whereby the hydrophobic dielectric 116 has a thickness 108 on top of the memory cells 160, measured from the top surface of the memory cells 160 to the corresponding top surface of the hydrophobic dielectric 116. In some embodiments, the thickness 108 is in a range from 200 Å to 2000 Å. In some embodiments, the thickness 108 is in a range from 500 Å to 1000 Å. In some embodiments, the thickness 108 is less than the depth 165 of the gaps 163. In some embodiments, the thickness 108 is half or less the depth 165 of the gaps 163.

An upper surface 111 of the hydrophobic dielectric 116 has a maximum height 139 over the semiconductor substrate 150 in a first region 153 of the semiconductor substrate where the array 159 of memory cells 160 is located. The upper surface 111 has a lesser maximum height 138 over the semiconductor substrate 150 in a second region 147 of the semiconductor substrate 150 which lacks the array 159 or any like feature between the metal interconnect layer 128D and the metal interconnect layer 128E. The upper surface 111 rises as it extends from the second region 147 into the first region 153 to mound over the memory cells 160.

In some embodiments, the depth 165 of the gaps 163 is in a range from 500 Å to 5000 Å. In some embodiments, the depth 165 is in a range from 700 Å to 4000 Å. The hydrophobic dielectric 116 may be applied with a thickness that would be sufficient to fill the second region 147 up to a height of the memory cells 160, which would be a thickness nearly the same as the depth 165. In some embodiments, the maximum thickness 133 of the hydrophobic dielectric 116 in the second region 147 is less than the depth 165. In some embodiments, the maximum thickness 133 is half or less the depth 165. In some embodiments, the thickness 133 is in a range from 300 Å to 3000 Å. In some embodiments, the thickness 133 is in a range from 400 Å to 2000 Å. In some embodiments, the thickness 133 is in a range from 500 Å to 1000 Å.

A precursor of the hydrophobic dielectric 116 may be drawn into the gaps 163. As a result, in some embodiments a maximum thickness 108 of the hydrophobic dielectric 116 on top of the memory cells 160 is less than a maximum thickness 133 of the hydrophobic dielectric 116 in the second region 147. In some embodiments, the thickness 108 is three quarters or less the thickness 133. In some embodiments, the thickness 108 is one half or less the thickness 133.

In addition to varying in height between the first region 153 and the second region 147, the upper surface 111 of the hydrophobic dielectric 116 varies within the first region 153. The height may vary between valleys 105 located over the gaps 163 and peaks 107 centered over the memory cells 160. In some embodiments, the valleys 105 include flat areas 106 at their bases.

The hydrophobic dielectric 116 may be, for example, hydrophobic silicon carbide (SiC), silicon carbonitride (SiCN), silicon oxycarbide (SiOC), silicon oxycarbonitride (SiOCN), or the like. Silicon, oxygen, carbon, and nitrogen can be present in varying amounts provided that the upper surface 111 is hydrophobic. In some embodiments, the hydrophobic dielectric 116 is a low-κ dielectric. In some embodiments, the hydrophobic dielectric 116 is SiOC or the like. In some embodiments, the hydrophobic dielectric 116 is the product of a flowable chemical vapor deposition (FCVD) process.

Figure 2A:
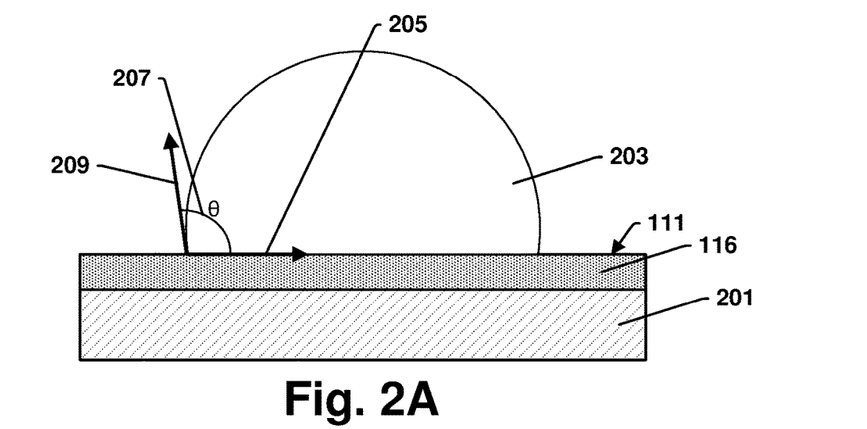
FIG. 2A illustrates a wafer contact angle for a hydrophobic material.

As illustrated in FIG. 2A, the hydrophobic dielectric 116 has a wafer contact angle (WCA) 207 or 90° or more. FIG. 2A illustrates a water droplet 203 on a substrate 201 over which has been formed a layer of the same material as the hydrophobic dielectric 116. The WCA 207 is an angle formed by the water-solid interface 205 and the water-vapor interface 209. In some embodiments, the hydrophobic dielectric 116 has a WCA 207 in the range from 90° to 120°. In some embodiments, the hydrophobic dielectric 116 has a WCA 207 in the range from 95° to 110°. In some embodiments, the WCA 207 is about 100° to about 105°.

Referring again to FIG. 1, an interfacial layer 115 is disposed on the surface 111 of the hydrophobic dielectric 116. The interfacial layer 115 may have a substantially uniform thickness over the hydrophobic dielectric 116. In some embodiments, the interfacial layer 115 is thinner than the thickness 133 of the hydrophobic dielectric 116 in the second region 147. In some embodiments, the interfacial layer 115 has a thickness half or less the thickness 133. In some embodiments, the interfacial layer 115 has a thickness one fourth or less the thickness 133. In some embodiments, the interfacial layer 115 has a thickness in the range from 50 Å to 1000 Å. In some embodiments, the interfacial layer 115 has a thickness in the range from 100 Å to 700 Å. In some embodiments, the interfacial layer 115 has a thickness in the range from 200 Å to 500 Å.

In some embodiments, the upper surface 109 of the interfacial layer 115 has high and low areas that correspond to high and low areas of the hydrophobic dielectric 116. Like the upper surface 111 of the hydrophobic dielectric 116, the upper surface 109 of the interfacial layer 115 has a greater maximum height over the semiconductor substrate 150 in the first region 153 as compared to the second region 147. In some embodiments, the upper surface 109 has a varying height in the first region 153. In some embodiments, the upper surface 109 has valleys 105 located over the gaps 163 and peaks 107 centered over the memory cells 160.

Figure 2B:
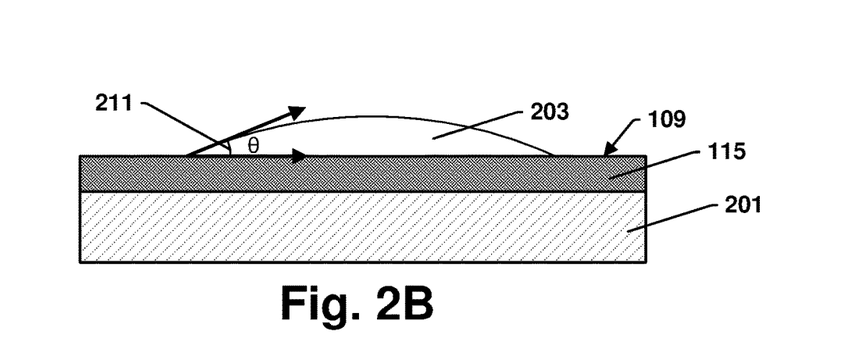
FIG. 2B illustrates a wafer contact angle for a hydrophilic material.

The interfacial layer 115 may include one dielectric layer or a stack of dielectric layers that bind the interlayer dielectric 114 to the hydrophobic dielectric 116. A lower surface of the interfacial layer 115 contacts and adheres to the hydrophobic dielectric 116. An upper surface 109 of the interfacial layer 115 adheres to the interlayer dielectric 114. As shown in FIG. 2B the upper surface 109 is hydrophilic. If the interfacial layer 115 is applied to the substrate 201, the water droplet 203 forms a WCA 211 that is less than 90°. In some embodiments, the WCA 211 is 50° or less. In some embodiments, the WCA 211 is 10° or less. In some embodiments, the WCA 211 is about 5°.

The interfacial layer 115 adheres to the surface 111 while itself providing an upper surface 109 that is hydrophilic. In some embodiments, the interfacial layer 115 is or comprises silicon nitride ($Si_3N_4$), another dielectric that includes silicon and nitrogen, or the like. Silicon nitride adheres well to hydrophobic SiOC and may have a WCA that is 5° or less. In some embodiments, the interfacial layer 115 is or comprises a silicon oxycarbide (SiOC) that is oxygen rich in comparison to a hydrophobic SiOC. Oxygen rich SiOC may have a WCA that is 10° or less. In some embodiments, the interfacial layer 115 is or comprises a silicon oxynitride (SiON) or the like. In some embodiments, the interfacial layer 115 is or comprises silicon rich oxide (SRO) or the like. SRO may have a WCA that is 6° or less. In some embodiments, the interfacial layer 115 is or comprises a silicon dioxide ($SiO_2$) layer that is distinct from the interlayer dielectric 114 in density or other property. The silicon dioxide layer may have a WCA in the range from 5° to 7°.

The interlayer dielectric 114 adheres to the upper surface 109 and fills space between the upper surface 109 and a metal interconnect layer that lies above, such as the metal interconnect layer 128E. In some embodiments, the interlayer dielectric 114 extends into and forms a dielectric matrix for the overlying metal interconnect layer 128E. In some embodiments, the interlayer dielectric 114 has a planar upper surface. In some embodiments, the interlayer dielectric 114 has a greater thickness in the second region 147 as compared to the first region 153.

The interlayer dielectric 114 may be much thicker than either the hydrophobic dielectric 116 or the interfacial layer 115. In some embodiments, the interlayer dielectric 114 is two or more times the thickness 133 or the hydrophobic dielectric 116 in the second region 147. In some embodiments, the interlayer dielectric 114 is four or more times the thickness 133. In some embodiments, the interlayer dielectric 114 has a thickness of 1000 Å or more in the second region 147. In some embodiments, the interlayer dielectric 114 has a thickness of 2000 Å or more in the second region 147. In some embodiments, the interlayer dielectric 114 has a thickness of 4000 Å or more in the second region 147.

The interlayer dielectric 114 is a hydrophilic dielectric. In some embodiments, the interlayer dielectric 114 has a smaller WCA than interfacial layer 115. In some embodiments, the interlayer dielectric 114 may has a WCA from 1° to 10°. In some embodiments, interlayer dielectric 114 is undoped silicate glass (USG), which has a WCA of about 4°. The interlayer dielectric 114 may be a hydrophilic dielectric other than undoped silicate glass, however, many low-K dielectrics are by design hydrophobic. In some embodiments, the interlayer dielectric 114 has a lower WCA than the interfacial layer 115.

The semiconductor substrate 150 may be, for example, a bulk semiconductor substrate (e.g., a bulk silicon substrate), a silicon-on-insulator (SOI) substrate, or the like The semiconductor may be or comprise silicon (Si), geranium (Ge), silicon geranium (SiGe), oxide semiconductors such as indium gallium zinc oxide (IGZO), Group III-V materials such as indium gallium arsenide (InGaAS), or the like. The metal features 136, the bit lines 101, the vias 130, and the vias 112 of the metal interconnect structure 157 may be or comprise a metal such as aluminum, copper, tungsten, or the like. Etch stop layers 143 disposed over metal interconnect layer 128A-128E may be or comprise a dielectric such as silicon nitride ($Si_3N_4$), silicon carbide (SiC), silicon oxynitride (SiON), silicon oxycarbide (SiOC), or the like. The interlayer dielectric 137 may be the same dielectric as interlayer dielectric 114 or some other dielectric.

The memory cells 160 may be conductive bridging random access memory (CBRAM) cells, phase change random access memory (PcRAM) cells, resistive random-access memory (ReRAM) cells, oxygen displacement memory (OxRAM) cells, magnetoresistive random access memory (MRAM) cells, ferroelectric random access memory (FRAM) cells, phase-change memory (PCM) cells, carbon nanotube random access memory (NRAM) cells, the like, or any other type of memory cell that includes a top electrode 120, a data storage layer 121, and a bottom electrode 122.

Each of the top electrode 120 and the bottom electrode 122 may include one layer of one conductive material or a plurality of layer of various conductive materials. Conductive materials suitable for the top electrode 120 or the bottom electrode 122 may include, for example, one or more of titanium (Ti), tantalum (Ta), tungsten (W), titanium nitride (TiN), tantalum nitride (TaN), cobalt (Co), copper (Cu), and the like.

The data storage layer 121 may also be either one layer or multiple layers of various materials. The identity of the material or materials depends on the memory type. The data storage layer 121 may include an amorphous oxide layer that reversibly forms conductive bridges and may further include an active metal layer that alternate donates and receives ions from the amorphous oxide layer. The data storage layer 121 may include two ferromagnetic layers separated by an insulating layer to form a metal tunneling junction. The data storage layer 121 may be a chalcogenide glass or other material that can be reversibly undergo a phase change to vary resistance. The data storage layer 121 may have other structures or compositions, depending on the memory type. Instead of being an array or memory cells 160, the array 159 may be an array of capacitors.

The memory cells 160 may have any suitable coupling and control structure. In this example, the memory cells 160 in the array 159 are accessed through word lines 124 and bit lines 101. For purposes of illustration, a bit line 101A is shown extending in the plane of FIG. 1, but generally word lines 124 and bit lines 101 are orthogonal. In this example, each bit line 101 is selectively couple to a first voltage rail 140 through a first transistor 145 and each word line 124 is couple to a second voltage rail 141 through a second transistor 152. More generally, any suitable type of access selector apparatus may be used for the memory cells 160.

FIGS. 3-16 provide a series of cross-sectional views 300-1600 that illustrate an integrated circuit device according to the present disclosure at various stages of manufacture according to a process of the present disclosure. Although FIGS. 3-16 are described in relation to a series of acts, it will be appreciated that the order of the acts may in some cases be altered and that this series of acts are applicable to structures other than the ones illustrated. In some embodiments, some of these acts may be omitted in whole or in part. Furthermore, it will be appreciated that the structures shown in FIGS. 3-16 are not limited to a method of manufacture but rather may stand alone as structures separate from the method.

Figure 3:
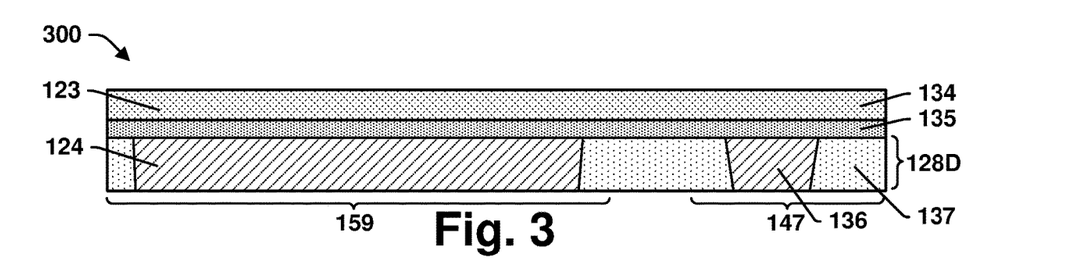
FIGS. 3-16 illustrate a series of cross-sectional views of an IC device according to some aspects of the present disclosure undergoing a manufacturing process according to some aspects of the present disclosure.

As illustrated by the cross-sectional view 300 of FIG. 3, the process may begin with deposition of an etch stop layer 135 and a via dielectric layer 134 over the metal interconnect layer 128D or some other metal interconnect layer that has been formed over the semiconductor substrate 150 or some other substrate. The metal interconnect layer 128D may have been formed by any suitable process. Examples of suitable processes include damascene and dual damascene processes. Etch stop layer 135 may be, for example, silicon carbide (SiC), silicon nitride ($Si_3N_4$), or the like. Via dielectric layer 134 may include one or more layers of dielectric materials such as silicon rich oxide (SRO), silicon dioxide ($SiO_2$), silicon nitride ($Si_3N_4$), silicon oxynitride (SiON), silicon oxycarbide (SiOC), or the like. Etch stop layer 135 and via dielectric layer 134 may be formed by any suitable processes or combinations of processes such as atomic layer deposition (ALD), chemical vapor deposition (CVD), or the like. As used herein, plasma enhanced ALD is a type of ALD and plasma enhanced CVD is a type of CVD.

Figure 4:
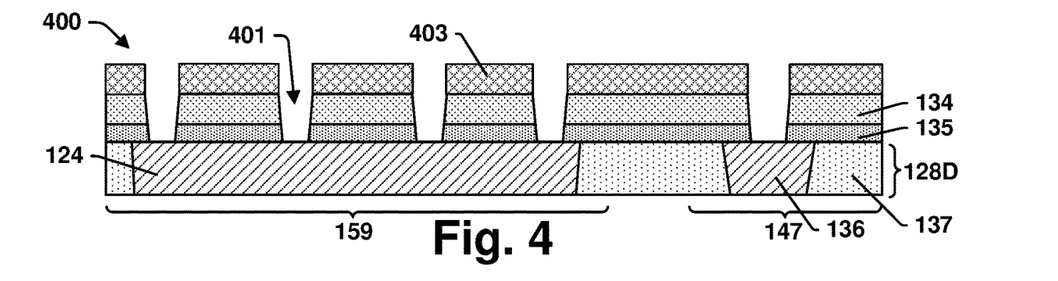

As illustrated by the cross-sectional view 400 of FIG. 4, a mask 403 may be formed over the via dielectric layer 134 and used to form openings 401 through the via dielectric layer 134 and the etch stop layer 135. The openings 401 may be positioned over the word line 124 or other metal features of metal interconnect layer 128D. The mask 403 may be a photoresist mask patterned using photolithography. The openings 401 may be formed using any suitable etch process or processes. A suitable etch process may be a dry etch process such as plasma etching.

Figure 5:
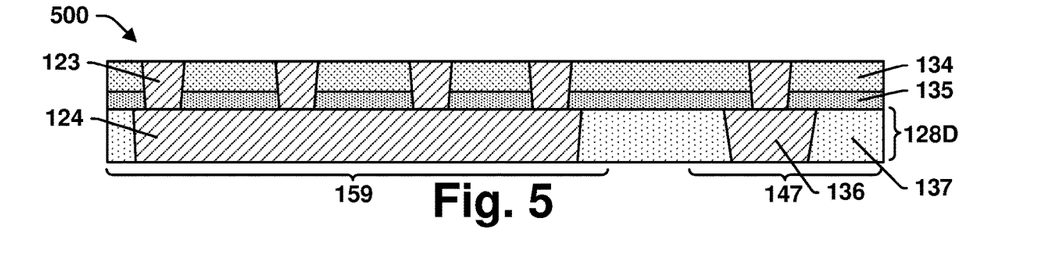

As illustrated by the cross-sectional view 500 of FIG. 5, the mask 403 may be stripped followed by deposition or growth of conductive material that fills the openings 401 and, after planarization, provides the vias 123. The conductive material may be deposited by any suitable process, for example, physical vapor deposition (PVD), electroplating, electroless plating, or the like. The planarization process may be chemical mechanical polishing (CMP) or any other suitable planarization process.

Figure 6:
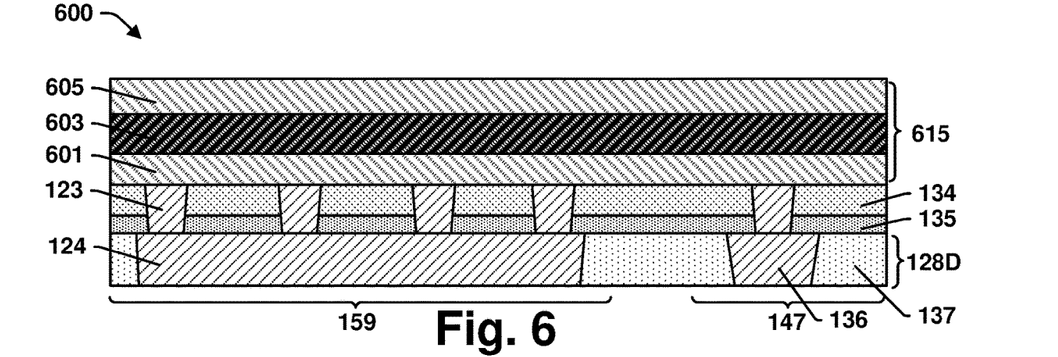

As illustrated by the cross-sectional view 600 of FIG. 6 a memory cell stack 615 may be formed over the surface of the structure illustrated by cross-sectional view 500 of FIG. 5. The memory cell stack 615 includes a bottom electrode layer 601, a data storage layer 603, and a top electrode layer 605. Each of these layers may include one or more sublayers. Each layer or sub layer may be formed by any suitable process or combination of processes. Depending on the composition, a suitable process may be, for example, physical vapor deposition (PVD), atomic layer deposition (ALD), chemical vapor deposition (CVD), variants thereof, or the like.

Figure 7:
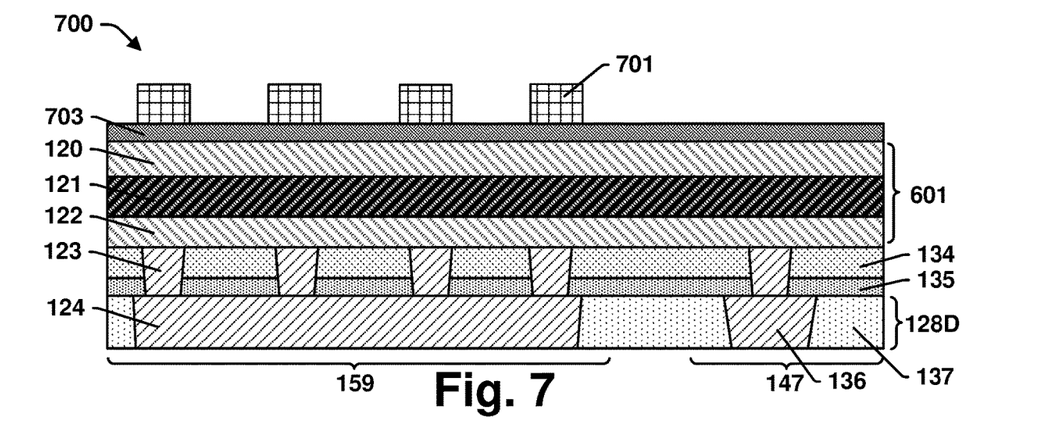

As illustrated by the cross-sectional view 700 of FIG. 7, a hard mask layer 703 and a photoresist 701 may be formed and patterned over the memory cell stack 615. These may be used to pattern memory cells 160 from memory cell stack 615 as illustrated by the cross-sectional view 800 of FIG. 8. The hard mask layer 703 is optional. Patterning forms top electrodes 120 from the top electrode layer 605, data storage layers 121 from the data storage layer 603, and the bottom electrodes 122 from the bottom electrode layer 601. Patterning may use any suitable etch process or combination of etch processes, for example, a dry etching process such as plasma etching or the like.

Figure 8:
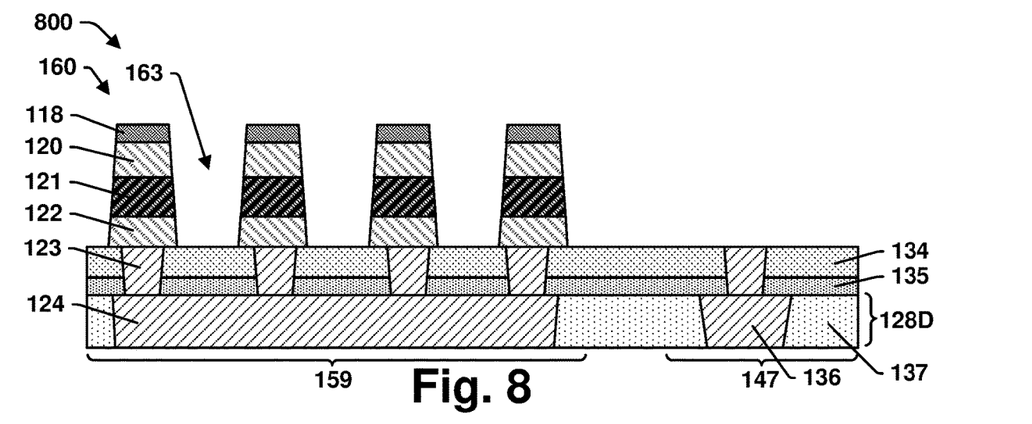

Patterning may form the etch stop layers 118 from the hard mask layer 703 or the hard mask layer 703 may be removed entirely during, or subsequent to, the patterning of memory cells 160. The memory cells 160 form the array 159 in the first region 153 (See FIG. 1). The memory cell stack 615 may be removed entirely from the second region 147. Patterning leaves narrow gaps 163 between memory cells 160.

Figure 9:
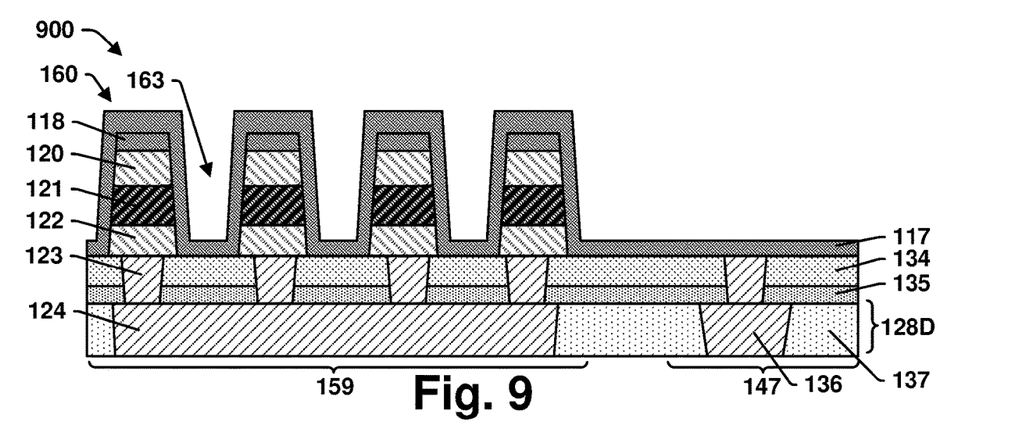

As illustrated by the cross-sectional view 900 of FIG. 9, an encapsulation layer 117 may be formed to cover the tops and sides of the memory cells 160. The sides of the memory cells 160 may be protected by sidewall spacers of the type formed with anisotropic etching. In some embodiments, however, the sides of the memory cells 160 are protected only by the encapsulation layer 117 which is formed by a conformal deposition process to avoid excessively narrowing the already narrow gaps 163. Chemical vapor deposition (CVD) or physical vapor deposition (PVD) may be made conformal. In some embodiments, the encapsulation layer 117 is formed by a highly conformal deposition process such as atomic layer deposition (ALD) or the like. In some embodiments, the encapsulation layer 117 has a thickness in the range from 40 Å to 400 Å. In some embodiments, the encapsulation layer 117 has a thickness in the range from 70 Å to 300 Å. In some embodiments, the encapsulation layer 117 has a thickness in the range from 100 Å to 200 Å. In some embodiments, the encapsulation layer 117 has the same composition as the etch stop layers 118.

Figure 10:
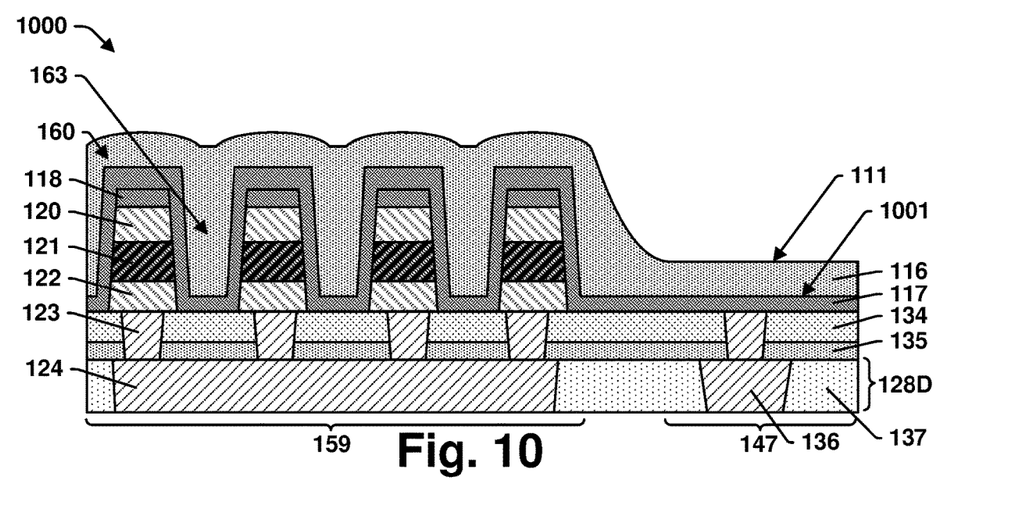

As illustrated by the cross-sectional view 1000 of FIG. 10, the hydrophobic dielectric 116 is formed over the encapsulation layer 117 by a flowable CVD process. The flowable CVD process begins with deposition of a low viscosity film. In some embodiments, the low viscosity film is formed on the surface 1001 from reagents including some that undergo polymerization reactions in the vapor phase prior to depositing on the surface 1001. In some embodiments, the reagents include one or more organosilicon compounds and one or more oxygen sources, which react to form a flowable oxide that fills gaps 163. After it has filled the gaps 163, the flowable oxide is subjected to a curing process that causes the flowable oxide to further polymerize, cross-link, and solidify to form the hydrophobic dielectric 116.

Examples of organosilicon compounds include siloxanes, silazoxanes, halogenated siloxanes, aminosilanes, disilanes, cyclic silanes, organocyclosilanes, and the like. Examples of siloxanes include triethoxysiloxane, tetramethoxysiloxane (tetramethyl orthosilicate, TMOS), trimethoxysiloxane, hexamethoxydisiloxane, octamethoxytrisiloxane, octamethylcyclotetrasiloxane (OMCTS), octamethoxydodecasiloxane, and the like. Examples of silazoxanes include hexamethoxydisilazoxane, methyl hexamethoxydisilazoxane, chlorohexamethoxydisilazoxane, hexaethoxy-disilazoxane, nonamethoxytrisilazoxane, octamethoxycyclosilazoxane, and the like. Examples of halogenated siloxanes include tetrachlorosilane, dichlorodiethoxysiloxane, chlorotriethoxysiloxane, hexachlorodisiloxane, octachlorotrisiloxane, and the like. Examples of aminosilanes include trisilylamine, hexamethyldisilazane, silatrane, tetrakis(dimethylamino)silane, bis(diethylamino)silane, tris(dimethyl-amino)chlorosilane, methylsilatrane, and the like. Example of disilanes include alkoxy disilanes, alkoxy-alkyl disilanes, alkoxy-acetoxy disilanes, and the like. Examples of cyclic silanes include butasilanes, pentasilanes, hexasilanes, heptasilanes, octasilanes, and the like. Examples of organocyclosilanes include cyclobutasilane, cyclopentasilane, cyclohexasilane, cycloheptasilane, cyclooctasilane, and the like.

The oxygen source may be, for example, oxygen ($O_2$), ozone ($O_3$), a nitrogen-oxygen compound such as nitric oxide (NO), nitrogen dioxide ($NO_2$), nitrous oxide ($N_2O$), or the like, a hydrogen-oxygen compound such as water ($H_2O$), hydrogen peroxide ($H_2O_2$), or the like, or a carbon-oxygen compound such as carbon monoxide (CO), carbon dioxide ($CO_2$), or the like. The gaseous reagents may be mixed with one or more carrier gases such as helium (He), neon (Ne), argon (Ar), hydrogen ($H_2$), and the like. In some embodiments, the reagents include a nitrogen source such as ammonia ($NH_3$) or the like. One or more of the reagents may be ionized or made to produce free radicals using a thermal source, an ultraviolet source, a radio frequency (RF) power source, a direct current (DC) power source, a microwave power source, or the like. The reaction temperature is typically between −10° C. and 150° C. and the chamber pressure is typically in the range from 0.5 torr to 10 torr.

In some embodiments, curing includes exposure to ultraviolet (UV) light. Alternatively, or additionally, curing may include one or more of heating, exposure to an oxygen source, an electron beam, an acid, a base, or the like. In some embodiments, curing include exposure to UV light while the semiconductor substrate 150 is at a temperature in the range from about 100° C. to about 500° C. In some embodiments, curing include exposure to UV light while the semiconductor substrate 150 is at a temperature in the range from about 250° C. to about 400° C. In some embodiments, curing includes a "condensation" reaction in which silanol groups (Si—OH) react to form Si—O—Si links while releasing water ($H_2O$). In some embodiments, formation of the flowable oxide film and curing of the flowable oxide film take place in a CVD system that includes a chamber. In some embodiments, the CVD system includes a remote plasma source (RPS).

Figure 11:
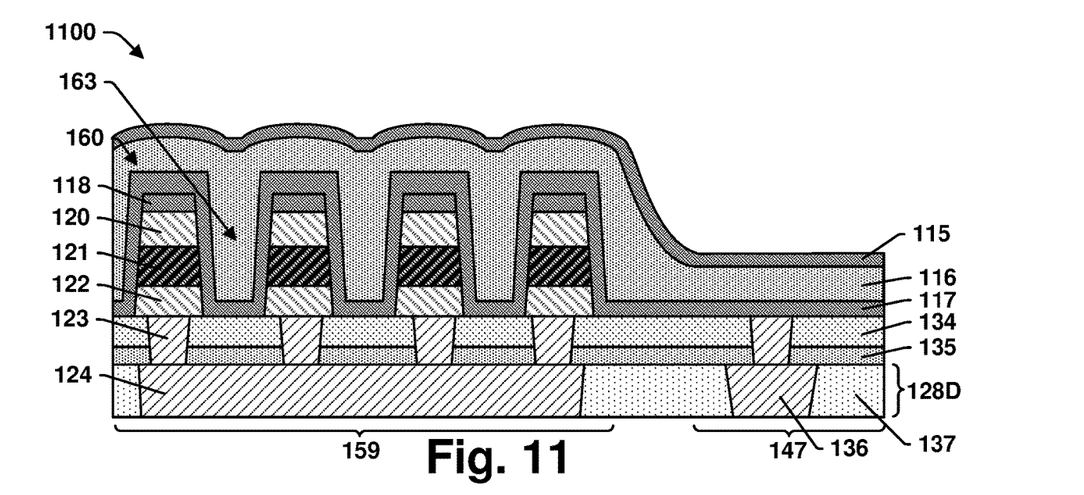

As illustrated by the cross-sectional view 1100 of FIG. 11, the interfacial layer 115 is formed over the hydrophobic dielectric 116. In some embodiments, the interfacial layer 115 is formed by a conformal deposition process. In some embodiments, the interfacial layer 115 is formed by CVD. In some embodiments, the interfacial layer 115 is formed in the same CVD system as the one used to form the hydrophobic dielectric 116. In some embodiments, the interfacial layer 115 includes silicon dioxide ($SiO_2$), silicon rich oxide (SRO), silicon nitride ($Si_3N_4$), or the like. An $SiO_2$ or an SRO film may be formed by CVD using silane ($SiH_4$) or tetraethyl orthosilicate (TEOS), an oxygen source, and/or a nitrogen source such as ammonia ($NH_3$) or the like. In some embodiments, the CVD process is a plasma enhanced chemical vapor deposition (PECVD) process.

In some embodiments, forming the interfacial layer 115 includes forming a flowable oxide film. An interfacial layer 115 formed from a flowable oxide film may be an oxygen rich silicon oxycarbide (SiOC), silicon oxynitride (SiON), or the like. Increasing the oxygen content increases the hydrophilicity. Oxygen content may be increased by exposing the flowable oxide film to an oxygen source during a curing process that uses UV light. The oxygen source may be made into a plasma.

Figure 12:
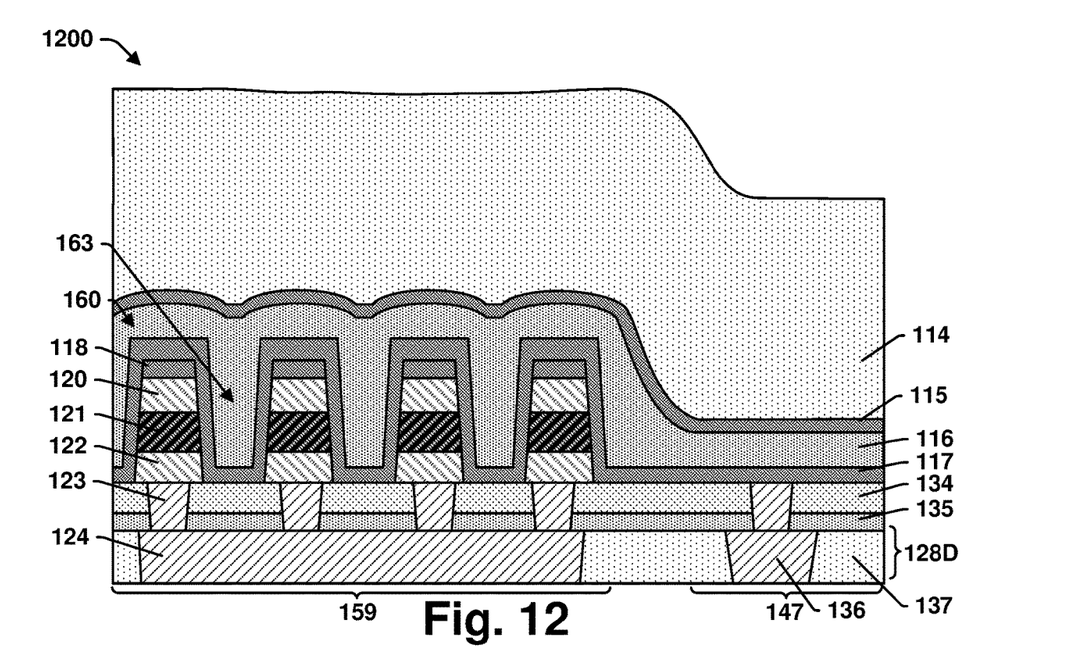

As illustrated by the cross-sectional view 1200 of FIG. 12, the interlayer dielectric 114 is formed over the interfacial layer 115. The interlayer dielectric 114 may be formed by CVD or the like or any other suitable process. In some embodiments, the interlayer dielectric 114 is undoped silicate glass (USG) formed from silane ($SiH_4$). In some embodiments, the interlayer dielectric 114 is undoped silicate glass (USG) formed from tetraethyl orthosilicate (TEOS). If both the interlayer dielectric 114 and the interfacial layer 115 are formed from TEOS, they are formed under different process conditions. In some embodiments, the difference results in the interfacial layer 115 being deposited at a lower rate than the interlayer dielectric 114.

Figure 13:
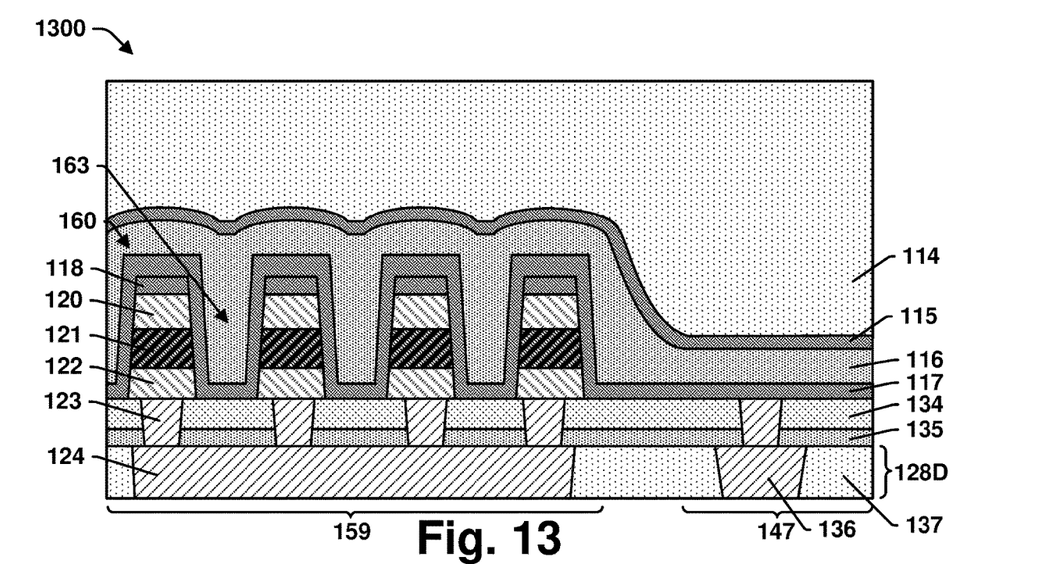

As illustrated by the cross-sectional view 1300 of FIG. 13, the interlayer dielectric 114 may be planarized. The planarization process may be chemical mechanical polishing (CVD). In some embodiments, the interfacial layer 115 prevents delamination that would occur during the CVD process if the interlayer dielectric 114 were formed directly over the hydrophobic dielectric 116.

Figure 14:
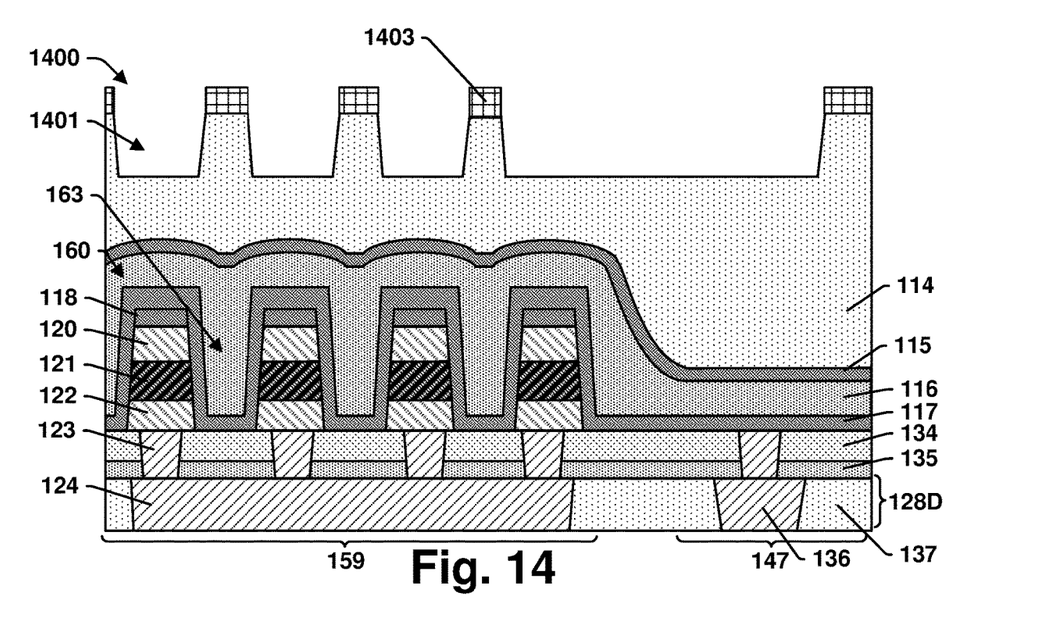
Figure 15:
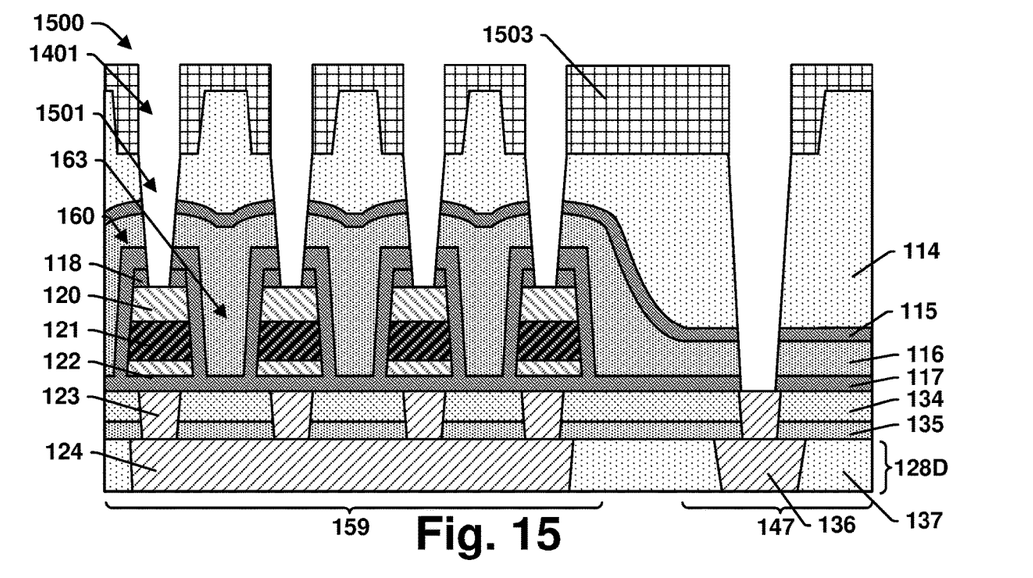

As illustrated by the cross-sectional view 1400 of FIG. 14, a resist 1403 may be formed over the interlayer dielectric 114 and used as a mask to etch openings 1401 in the interlayer dielectric 114. As illustrated by the cross-sectional view 1500 of FIG. 15, after stripping the resist 1403, a resist 1503 may be formed over the interlayer dielectric 114 and used as a mask to etch openings 1501 beneath the openings 1401 in the interlayer dielectric 114.

Figure 16:
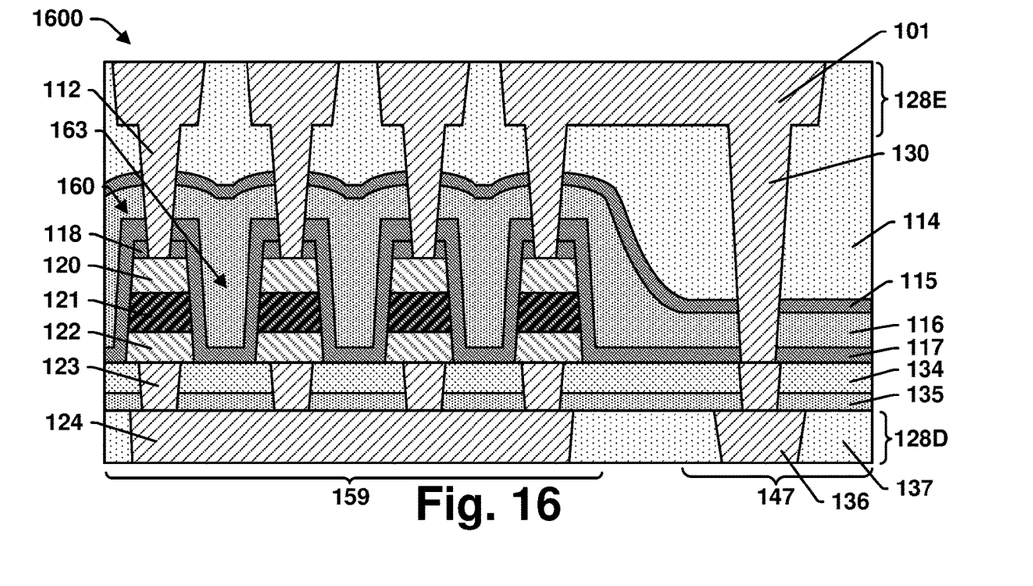

As illustrated by the cross-sectional view 1600 of FIG. 16, the resist 1503 may be stripped, metal deposited or grown to fill the openings 1401 and 1501, and planarization used to remove any metal outside the openings 1401 and 1501. The metal that fills the openings 1501 provides vias 112 and 130. The metal that fills the openings 1401 provides bit lines 101. In this example, the interlayer dielectric 114 extends to the top of the metal interconnect layer 128E. In some embodiments, an etch stop layer is formed at the base metal interconnect layer 128E and interlayer dielectric 114 extends only to that etch stop layer.

Figure 17:
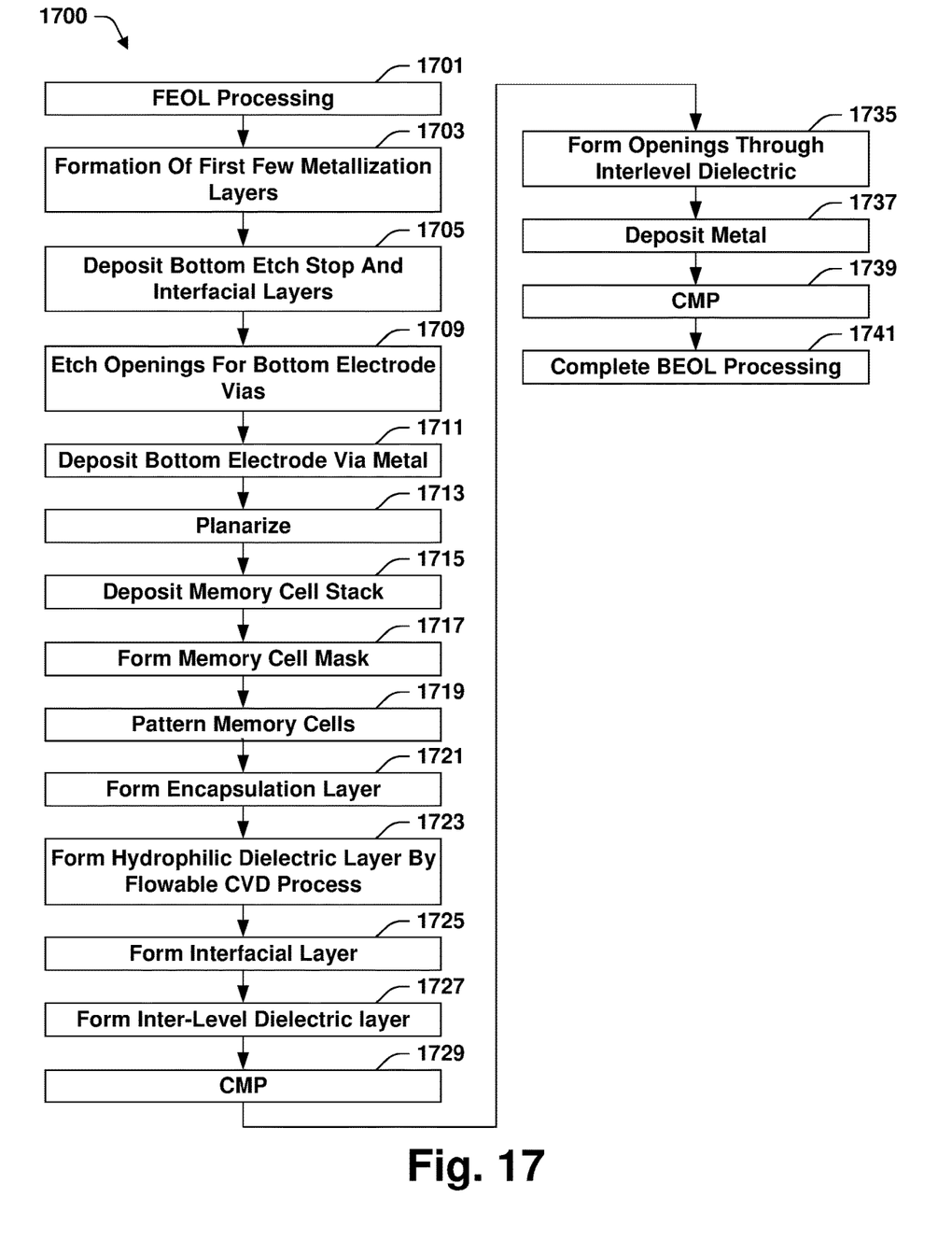
FIG. 17 presents a flow chart of a manufacturing process according to some aspects of the present disclosure.

FIG. 17 provides a flow diagram of some embodiments of a method 1700 of forming an integrated circuit device having an interfacial layer between a hydrophobic dielectric and an interlayer dielectric layer. While the method 1700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Act 1701 is front-end-of-line (FEOL) processing. The semiconductor substrate 150 may be in the form of a wafer after this processing. FEOL processing may include the formation of various devices such as diodes, transistors, and capacitors in and/or on the semiconductor substrate 150. The wafer received from FEOL processing is subjected to back-end-of-line (BEOL) processing.

Act 1703 is the BEOL processing and may include the formation of several metal interconnect layers 128. These may include the first metal interconnect layer 128A through the fourth metal interconnect layer 128D or a greater or lesser number of metal interconnect layers.

Act 1705 is depositing the etch stop layer 135 and the via dielectric layer 134 as shown by the cross-sectional view 300 of FIG. 3. Act 1709 is etching openings 401 through the etch stop layer 135 and the via dielectric layer 134 as shown by the cross-sectional view 400 of FIG. 4. Act 1711 is filling the openings 401 with metal and act 1713 is planarizing to form the vias 123 as shown by the cross-sectional view 500 of FIG. 5.

Act 1715 is depositing the memory cell stack 615 as shown by the cross-sectional view 600 of FIG. 6. The memory cell stack 615 may include the bottom electrode layer 601, the data storage layer 603, and the top electrode layer 605. Alternatively, memory cell stack 615 could be a capacitor cell stack or any layer or layers that will be used to form closely spaced features separated by narrow gaps.

Act 1717 is forming a mask for defining memory cells 160 from the memory cell stack 615. As shown by the cross-sectional view 700 of FIG. 7, this may include forming a hard mask layer 703 over the memory cell stack 615 and forming a photoresist 701 over the hard mask layer 703 to pattern the hard mask layer 703. Patterning the hard mask layer 703 forms the etch stop layers 118 (See FIG. 8).

Act 1719 is etching with a mask that includes the etch stop layers 118 to define the memory cells 160 from the memory cell stack 615 as shown by the cross-sectional view 800 of FIG. 8.

Act 1721 is forming the encapsulation layer 117 over the memory cells 160 as shown by the cross-sectional view 900 of FIG. 9. The encapsulation layer 117 may be formed by a highly conformal deposition process to avoid overly narrowing or pinching off the tops of gaps 163.

Act 1723 is forming the hydrophobic dielectric 116. As shown by the cross-sectional view 1000 of FIG. 10, the hydrophobic dielectric 116 fills the gaps 163 and extends above the memory cells 160 but may have an uneven upper surface 111. The hydrophobic dielectric 116 may be formed by an FCVD process. Act 1723 may include curing the hydrophobic dielectric 116.

Act 1725 is forming the interfacial layer 115 over the hydrophobic dielectric 116 as shown by the cross-sectional view 1100 of FIG. 11. Forming the interfacial layer 115 may include an FCVD process, in which case the interfacial layer 115 may be cured before proceeding to the next step.

Act 1727 is forming the interlayer dielectric 114 over the interfacial layer 115 as shown by the cross-sectional view 1200 of FIG. 12. Act 1729 is a CMP process that planarizes the interlayer dielectric 114 as shown by the cross-sectional view 1300 of FIG. 13. The interfacial layer 115 binds the interlayer dielectric 114 to the hydrophobic dielectric 116 preventing delamination during the CMP process.

Acts 1735 through Act 1739 represent a dual damascene process by which the vias 112, the vias 130, and the bit lines 101 may be formed. Alternatively, two single damascene or another type of dual damascene process may be used. In some dual damascene processes, an etch stop layer is formed just below a height at which the bit lines 101 will be disposed. With those processes, the CMP of act 1727 limits the height of the interlayer dielectric 114 to just below that etch stop layer, which will be near the tops of the vias 112 and the vias 130. In other dual damascene processes, the interlayer dielectric 114 rises through the level in which bit lines 101 will be formed.

Act 1735 is forming openings through the interlayer dielectric 114. These may be the openings 1401 as shown by the cross-sectional view 1400 of FIG. 14 and/or the openings 1501 as shown by the cross-sectional view 1500 of FIG. 15. The encapsulation layer 117 may perform the same function as an etch stop layer when etching the openings 1501 and, accordingly, is considered an etch stop layer.

Act 1737 is depositing or growing metal to fill those openings. Act 1739 is a CMP process by which excess metal is removed to provide a structure as shown by the cross-sectional view 1600 of FIG. 16. The interfacial layer 115 prevents delamination of the interlayer dielectric 114 during this CMP process as well.

Act 1741 is the completion of BEOL processing. This may include the formation of additional metal interconnect layers above the ones illustrated in the figures. A passivation layer may be formed over the metal interconnect structure 157 and the wafer may be cut into a large number of dies to provide a plurality of integrated circuit devices.

Some aspects of the present teaching provide an integrated circuit device that includes a semiconductor substrate, a metal interconnect structure, over the semiconductor substrate, and an array of device structures disposed between two metal interconnect layers of the metal interconnect structure. Each of the device structures has a top electrode. A hydrophobic dielectric fills gaps between the device structures and extends over the devices. An interlayer dielectric is above the hydrophobic dielectric and an interfacial layer is disposed between the interlayer dielectric and the hydrophobic dielectric. Top electrode vias connect the top electrodes to conductors within an upper of the two metal interconnect layers. The top electrode vias each rise from respective top electrodes and pass successively through the hydrophobic dielectric, the interfacial layer, and the interlayer dielectric.

Some aspects of the present teaching provide an integrated circuit device that includes a semiconductor substrate having a first region and a second region. A hydrophobic dielectric formed above the semiconductor substrate has an upper surface extending over the first region and the second region. An interfacial layer is disposed on the hydrophobic dielectric and has a hydrophilic upper surface. The hydrophilic upper surface has a greater maximum height over the semiconductor substrate in the first region than in the second region. An interlayer dielectric is above and adheres to the hydrophilic upper surface.

Some aspects of the present teaching provide a method that includes taking a semiconductor substrate including a first region and a second region, forming a hydrophobic dielectric above the semiconductor substrate by a flowable chemical vapor deposition process, and forming an interfacial layer on the hydrophobic dielectric. The interfacial has a hydrophilic upper surface extending over the first region and the second region. The hydrophilic upper surface has a greater maximum height over the semiconductor substrate in the first region than in the second region. An interlayer dielectric is formed on and adheres to the hydrophilic upper surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
a semiconductor substrate;
a metal interconnect structure comprising a plurality of metal interconnect layers over the semiconductor substrate;
an array of device structures disposed between two of the plurality of metal interconnect layers, wherein the device structures comprise top electrodes;
a hydrophobic dielectric that fills gaps between the device structures;
an interlayer dielectric disposed above the hydrophobic dielectric;
an interfacial layer of hydrophilic dielectric between the interlayer dielectric and the hydrophobic dielectric; and
top electrode vias connecting the top electrodes to conductors within an upper of the two metal interconnect layers;
wherein the top electrode vias rise from respective top electrodes and pass successively through the hydrophobic dielectric, the interfacial layer, and the interlayer dielectric.

2. The integrated circuit device of claim 1, wherein the top electrode vias rise through an etch stop layer before reaching the hydrophobic dielectric.

3. The integrated circuit device of claim 2, wherein the interfacial layer is thinner than the etch stop layer.

4. The integrated circuit device of claim 1, wherein the interfacial layer has a wafer contact angle (WCA) intermediate between that of the hydrophobic dielectric and that of the interlayer dielectric.

5. The integrated circuit device of claim 1, wherein
an upper surface of the hydrophobic dielectric has higher and lower areas; and
an upper surface of the interfacial layer has corresponding higher and lower areas.

6. An integrated circuit device, comprising:
a semiconductor substrate comprising a first region and a second region;
a hydrophobic dielectric above the semiconductor substrate, wherein the hydrophobic dielectric has an upper surface extending over the first region and the second region;
an interfacial layer over the hydrophobic dielectric, the interfacial layer having a hydrophilic upper surface having a greater maximum height over the semiconductor substrate in the first region than in the second region; and
an interlayer dielectric adhering to the hydrophilic upper surface.

7. The integrated circuit device of claim 6, wherein the hydrophobic dielectric fills gaps between device structures.

8. The integrated circuit device of claim 7, wherein the device structures are memory cells.

9. The integrated circuit device of claim 7, wherein the hydrophobic dielectric extends over the device structures.

10. The integrated circuit device of claim 6, wherein the hydrophobic dielectric comprises silicon oxycarbide (SiOC).

11. The integrated circuit device of claim 6, wherein:
the upper surface of the hydrophobic dielectric has hills and valleys in the first region; and
the hydrophilic upper surface has corresponding hills and valleys.

12. The integrated circuit device of claim 6 wherein the interfacial layer is a compound comprising silicon and nitrogen.

13. The integrated circuit device of claim 6 wherein the interfacial layer is thinner than the hydrophobic dielectric and thinner than the interlayer dielectric.

14. The integrated circuit device of claim 6, wherein the interfacial layer adheres more strongly to the hydrophobic dielectric than the interlayer dielectric is able to adhere to the hydrophobic dielectric.

15. An integrated circuit device, comprising:
an array of memory cells over a semiconductor substrate;
a hydrophobic dielectric that fills gaps between the memory cells and has an upper surface that is variable in height over the semiconductor substrate;
an interlayer dielectric disposed above the hydrophobic dielectric; and
an interfacial layer of hydrophilic dielectric between the interlayer dielectric and the hydrophobic dielectric;
wherein the interfacial layer is in direct contact with the hydrophobic dielectric and the interlayer dielectric.

16. The integrated circuit device of claim 15, wherein the hydrophilic dielectric has a wafer contact angle (WCA) intermediate between that of the hydrophobic dielectric and that of the interlayer dielectric.

17. The integrated circuit device of claim 15, further comprising an etch stop layer directly over the memory cells and directly under the hydrophobic dielectric.

18. The integrated circuit device of claim 17, wherein the interfacial layer is thinner than the etch stop layer.

19. The integrated circuit device of claim 17, wherein the interfacial layer comprises silicon dioxide, silicon rich oxide, or silicon nitride.

20. The integrated circuit device of claim 17, wherein the hydrophobic dielectric has an upper surface with a height that varies between a height greater than the memory cells and a height less than the memory cells.

* * * * *